United States Patent
Wang

(10) Patent No.: US 9,086,545 B2
(45) Date of Patent: Jul. 21, 2015

(54) SILICON-BASED OPTICAL FIBER CLAMP AND METHODS OF FABRICATING THE SAME

(71) Applicant: SHANGHAI HUA HONG NEC ELECTRONICS CO., LTD., Shanghai (CN)

(72) Inventor: Lei Wang, Shanghai (CN)

(73) Assignee: SHANGHAI HUA HONG NEC ELECTRONICS, Shanghai (CN)

( * ) Notice: Subject to any disclaimer, the term of this patent is extended or adjusted under 35 U.S.C. 154(b) by 0 days.

(21) Appl. No.: 14/031,684

(22) Filed: Sep. 19, 2013

(65) Prior Publication Data

US 2014/0093218 A1    Apr. 3, 2014

(30) Foreign Application Priority Data

Sep. 28, 2012    (CN) .......................... 2012 1 0367925

(51) Int. Cl.
*G02B 6/36* (2006.01)
*H01L 21/308* (2006.01)
*G02B 6/44* (2006.01)

(52) U.S. Cl.
CPC ............ *G02B 6/3644* (2013.01); *G02B 6/3664* (2013.01); *G02B 6/44* (2013.01); *H01L 21/308* (2013.01)

(58) Field of Classification Search
None
See application file for complete search history.

(56) References Cited

U.S. PATENT DOCUMENTS

| | | | |
|---|---|---|---|
| 6,522,817 B2 * | 2/2003 | Moran .......................... | 385/120 |
| 6,618,541 B2 * | 9/2003 | Kaiser et al. .................. | 385/137 |
| 7,116,884 B2 * | 10/2006 | Nakajima ..................... | 385/137 |
| 2003/0068153 A1 * | 4/2003 | Suzuki .......................... | 385/137 |
| 2003/0142909 A1 * | 7/2003 | Suzuki et al. .................. | 385/33 |
| 2004/0013397 A1 * | 1/2004 | Sherman et al. .............. | 385/147 |

* cited by examiner

*Primary Examiner* — Mike Stahl
(74) *Attorney, Agent, or Firm* — MKG LLC

(57) ABSTRACT

An optical fiber clamp and fabrication method thereof are disclosed. The optical fiber clamp includes one or more clamp units. Each clamp unit includes a clamp body formed of silicon, a guide hole formed under a top surface of the clamp body, the guide hole having an upper diameter greater than a lower diameter of the guide hole and having an inclined sidewall; and a locating hole connected to and extends downward from a bottom of the guide hole through the clamp body, the locating hole having an upper diameter equal to a lower diameter of the locating hole and smaller than the lower diameter of the guide hole.

15 Claims, 2 Drawing Sheets

SILICON-BASED OPTICAL FIBER CLAMP AND METHODS OF FABRICATING THE SAME

CROSS-REFERENCES TO RELATED APPLICATIONS

This application claims the priority of Chinese patent application number 201210367925.0, filed on Sep. 28, 2012, the entire contents of which are incorporated herein by reference.

TECHNICAL FIELD

The present disclosure relates to semiconductor fabrication methods used in the field of microelectronic chip manufacturing.

BACKGROUND

Because of a higher carrier frequency, an optical signal has a wider carrier width and can carry more information than an electric signal. Therefore, optical communications technology is predominant in mass information transmission applications.

In a variety of equipment for optical communications, optical fiber is the most commonly used type of transmission and access device for transmitting optical signals and interconnecting different optical signal processing modules. Different from the conventional electric signal connection, which is shown in FIG. 1, in order to enable low-loss transmission of an optical signal from one optical fiber to another through their end faces joined together, coupling between the two optical fibers requires the end faces to be strictly parallel, in close contact, and aligned at the centers with each other.

As the optical signal has a very high frequency and accordingly very short wave length, an inner diameter of an optical fiber is much smaller than an inner diameter of a conventional electric wire. For example, a single-mode optical fiber is only 125 microns in diameter. Therefore, optical fibers themselves are not rigid, and in order to meet the above discussed requirements on end faces of the two optical fibers, i.e., being strictly parallel, in close contact, and aligned at the centers, an optical fiber clamp for fixing and positioning the optical fibers is generally used.

Currently, most of the commonly used optical fiber clamps are made of metal, plastic, ceramics, glass, or the like, and a method for fabricating such an optical fiber clamp generally involves molding (or physical cutting), grinding, drilling and other processes. Specifically, clamp units are typically first produced by molding and then mechanically bored using proper drilling equipment. Such method is not suitable for mass production and the positioning accuracy of the clamps fabricated is limited by the processing machine or mold used therein and generally could only reach tens to hundreds of microns. Therefore, the method usually employs additional equipment or a high precision processing machine for improving the positioning accuracy. This may cause high production costs and be the reason for sustained high prices of optical communications equipment and components. Moreover, in the practical use, due to the existence of manufacturing tolerances between different components, errors in sizes of holes in an individual optical fiber clamp and errors between locating holes of different optical fiber clamps, there are a low success rate of coupling at the first attempt, a high risk for the optical fibers and the optical fiber clamps to be damaged, and high operation and maintenance costs.

SUMMARY OF THE INVENTION

An objective of the present invention is to provide a silicon-based optical fiber clamp which is capable of reducing the manufacturing cost of an individual optical fiber clamp, increasing the precision and lowering operation and maintenance costs thereof.

To achieve the above objective, a first aspect of the present invention provides an optical fiber clamp including one or more clamp units. Each clamp unit includes a clamp body formed of silicon; a guide hole formed under a top surface of the clamp body, the guide hole having an upper diameter greater than a lower diameter of the guide hole and having an inclined sidewall; and a locating hole connected to and extends downward from a bottom of the guide hole through the clamp body, the locating hole having an upper diameter equal to a lower diameter of the locating hole and smaller than the lower diameter of the guide hole.

In one specific embodiment, the optical fiber clamp comprises more than one clamp units and the more than one clamp units are arranged in a horizontal direction.

In one specific embodiment, each clamp unit has a thickness of 200 μm to 800 μm, typically of 350 μm to 550 μm.

In one specific embodiment, the guide hole has a depth of 20 μm to 150 μm, and the inclined sidewall of the guide hole has an inclination of 20 degrees to 60 degrees, typically of 35 degrees to 55 degrees.

In one specific embodiment, the locating hole has a depth of 250 μm to 500 μm and a size of 0.1 μm to 10 μm greater than a critical dimension of an optical fiber, typically the locating hole has a size of 0.5 μm to 2 μm greater than a critical dimension of an optical fiber.

In one specific embodiment, a difference between an actual size and a design size of a spacing between every two adjacent ones of the clamp units is ±0.1~10 μm, typically ±0.5~2 μm.

To achieve the above objective, a second aspect of the present invention provides a method of fabricating an optical fiber clamp. The method includes the steps of:

providing a silicon wafer which includes one or more clamp bodies;

forming a guide hole under a top surface of each clamp body, the guide hole having an upper diameter greater than a lower diameter of the guide hole and having an inclined sidewall; and forming a locating hole connected to and extends downward from a bottom of each guide hole through a corresponding clamp body, the locating hole having an upper diameter equal to a lower diameter of the locating hole and smaller than the lower diameter of the guide hole.

Specifically, the method may include the steps of:

a) spin-coating a photoresist on the silicon wafer and forming one or more guide hole patterns in the photoresist by photolithography;

b) forming one or more guide holes, each having a depth of 20 μm to 150 μm, by etching the silicon wafer using the photoresist as a mask;

c) removing the photoresist and depositing a hard mask layer having a thick of 0.5 μm to 10 μm over the silicon wafer;

d) spin-coating a negative photoresist and forming one or more locating hole patterns in the negative photoresist by photolithography, each locating hole pattern aligning with a corresponding one of the one or more guide holes;

e) forming one or more locating holes, each having a depth of 250 μm to 500 μm, by first etching the hard mask layer by using the negative photoresist as a mask and then etching the silicon wafer by using the hard mask layer as a mask, leaving a non-etched bottom portion of the silicon wafer with a thickness of 50 μm to 250 μm; and f) grinding a backside of the silicon wafer until the one or more locating holes are exposed.

In one specific embodiment, the hard mask layer formed in step c) is a silicon dioxide layer.

In one specific embodiment, the hard mask layer formed in step c) has a thickness of 0.5 μm to 2 μm.

In one specific embodiment, the method further includes the step of filling a negative photoresist in the one or more guide holes and removing a portion of the negative photoresist other than portions filled in the one or more guide holes by performing an etch-back process, prior to step c) and after step d).

In one specific embodiment, in step d), the spin-coated negative photoresist has a volume of 2 ml to 20 ml, typically of 4 ml to 8 ml, and the negative photoresist may be spin-coated in multiple steps.

In one specific embodiment, in step d), the multiple steps for spin-coating the negative photoresist include: 1) providing a volume of 1 ml to 10 ml of the negative photoresist and spin-coating the negative photoresist in 1 to 5 cycles, each cycle including a coating period of 2 s to 15 s at a rotation speed of 500 rpm to 1200 rpm and an idle interval of 0.5 s to 5 s thereafter; 2) repeating step 1) once to thrice; 3) providing a volume of 0.2 ml to 5 ml of the negative photoresist and spin-coating the negative photoresist for 2 s to 15 s at a rotation speed of 800 rpm to 1500 rpm; and 4) repeating step 3) once to thrice.

Advantageously, the present invention employs mature semiconductor fabrication processes, a commonly used silicon wafer as a base for fabricating the optical fiber clamp, and photolithography equipment to carry out strict control on the size and spacing as well as other physical dimensions of the optical fiber clamp, thereby achieving a submicron order positioning accuracy, much higher than a positioning accuracy of the currently commonly used mechanical processing approach. Moreover, with the use of the ultra-large-scale integration process in the invention, a large number of the strictly controlled clamp units having the same specifications can be formed on a single silicon wafer, thus greatly reducing the manufacturing cost of an individual clamp unit. Therefore, obviously, the invention is also advantageous over the conventional mechanical processing approach in cost control.

BRIEF DESCRIPTION OF THE DRAWINGS

To further describe the present invention, reference is made to the following detailed description on exemplary embodiments, taken in conjunction with the accompanying drawings, in which.

DETAILED DESCRIPTION

Figure 1:
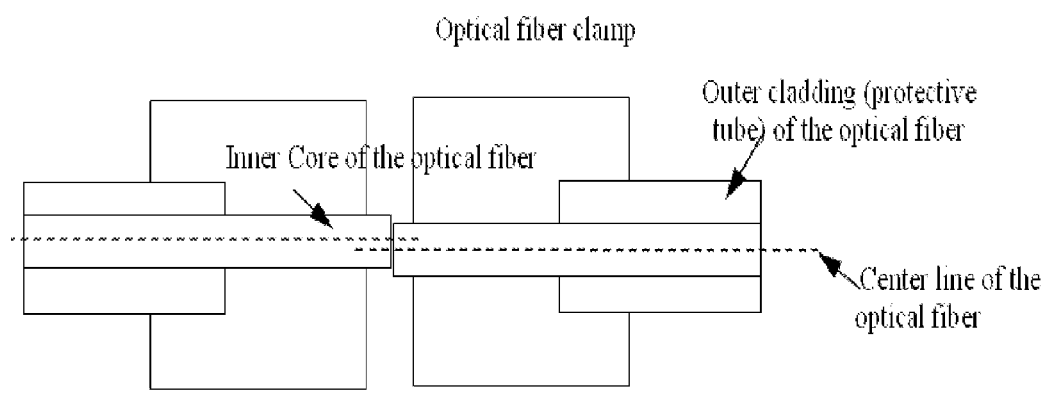
FIG. 1 shows a schematic illustration showing the coupling between optical fibers.
Figure 2:
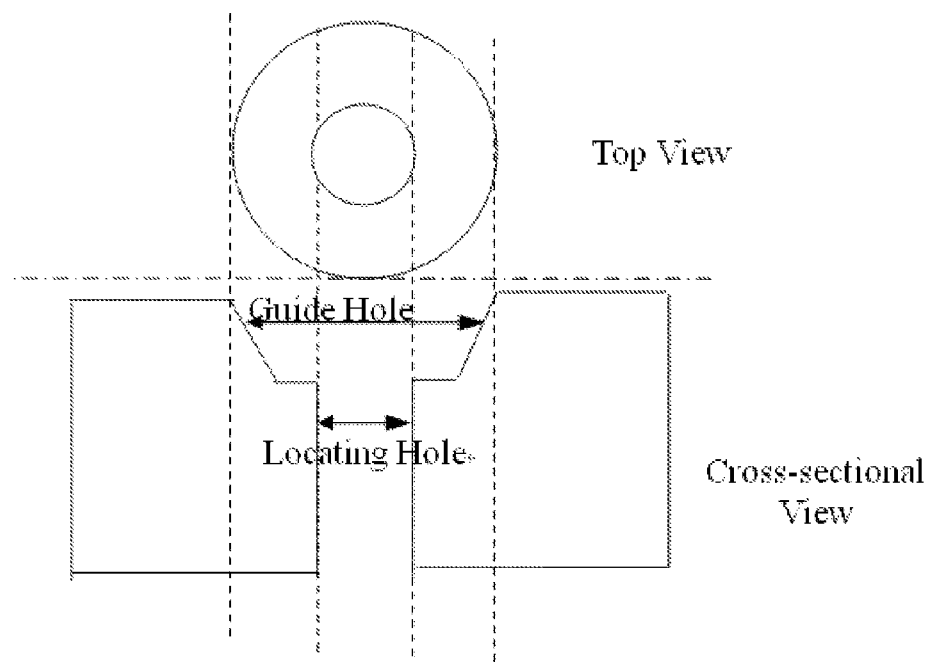
FIG. 2 depicts a clamp unit of the optical fiber clamp of the present invention.

The present invention is to provide a silicon-based optical fiber clamp. One or more clamp units may be formed on a single silicon wafer. As illustrated in FIG. 2, each clamp unit of the optical fiber clamp includes a clamp body, a guide hole and a locating hole, wherein, the clamp body is formed of silicon, the guide hole and the locating hole are formed in two different steps. After the guide hole is formed, photoresist needs to be filled therein and a pattern for the locating hole is to be formed in the photoresist. At this point, negative photoresist should be used because it can be removed without being exposed in advance. As such, the photoresist filled in the guide hole can be totally removed after the locating hole is formed.

Otherwise, if positive photoresist is used which can be removed only after being exposed, as the guide hole has a depth of 20 μm to 150 μm, the existing photolithography equipment cannot achieve a uniform and controllable exposure with such a depth, which will result in residues of positive photoresist in the guide hole. Thus, the negative photoresist must be used herein.

The present invention is capable of reducing the manufacturing cost of an individual optical fiber clamp, increasing the precision and lowering operation and maintenance costs thereof.

Figure 4:
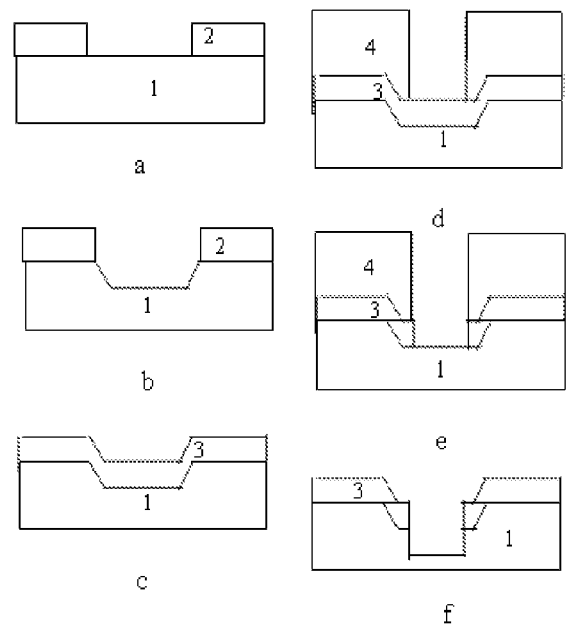
FIG. 4 schematically illustrates a method for fabricating the optical fiber clamp of the present invention.

A silicon wafer, for example, a commonly used 8 inch silicon wafer with a thickness of 725 μm and a diameter of 200 mm, can be used to form an optical fiber clamp unit of the present invention by a method, as shown in FIG. 4. Although only one clamp unit is shown in FIG. 4, those skilled in the art shall appreciate that a plurality of clamp units having the same specifications can be simultaneously formed on the same silicon wafer. The method includes the steps of:

a) Referring now to FIG. 4a, spin-coating photoresist 2 on the silicon wafer 1 and forming a guide hole pattern in the photoresist 2 by photolithography, wherein any type of the photoresist 2 can be used and the thickness of the photoresist 2 should be greater than 1 μm;

b) Referring now to FIG. 4b, forming the guide hole, which preferably has a depth of 20 μm to 150 μm, by etching the silicon wafer 1 using the photoresist 2 as a mask, wherein the silicon wafer 1 may be etched either by a wet etching process or by a dry etching process to make sure that the formed guide hole has an inclined sidewall with an inclination of 20 degrees to 60 degrees; and the surface of the inclined sidewall is smooth without sharp protrusions or portions that are excessively or not enough inclined, such that when an optical fiber is inserted in, the end face of the optical fiber will not be damaged due to collision or friction;

c) Referring now to FIG. 4c, depositing a hard mask layer 3 with a thickness of 0.5 μm to 10 μm, typically of 0.5 μm to 2 μm, wherein the hard mask layer 3 may be a silicon dioxide layer;

d) Referring now to FIG. 4d, spin-coating a negative photoresist 4 over the hard mask layer 3 and forming a locating hole pattern in the negative photoresist 4 by photolithography. The locating hole pattern is aligned with the guide hole and has a smaller dimension than the guide hole. In order to ensure a good filling result, a volume of the provided negative photoresist 4 may be greater than 2 ml, typically of 4 ml to 8 ml. Moreover, during the exposure, the focus is set at the surface of the silicon wafer 1 rather than at the bottom of the guide hole, such that portions of the negative photoresist 4 coated on the surface of the silicon wafer 1 are exposed and remained while a portion of the negative photoresist 4 filled in guide hole is not exposed and hence be removed in a developing process;

e) Referring now to FIGS. 4e and 4f, forming the locating hole having a depth of 250 μm to 500 μm by first etching the hard mask layer 3 using the negative photoresist 4 as a mask and then removing the negative photoresist 4 and etching the silicon wafer 1 using the hard mask layer 3 as a mask, leaving a non-etched bottom portion of the silicon wafer 1 with a thickness of 50 µm to 250 µm; and f) Referring now to FIG. 2, grinding a backside of the silicon wafer 1 until the locating hole is exposed.

Figure 3:
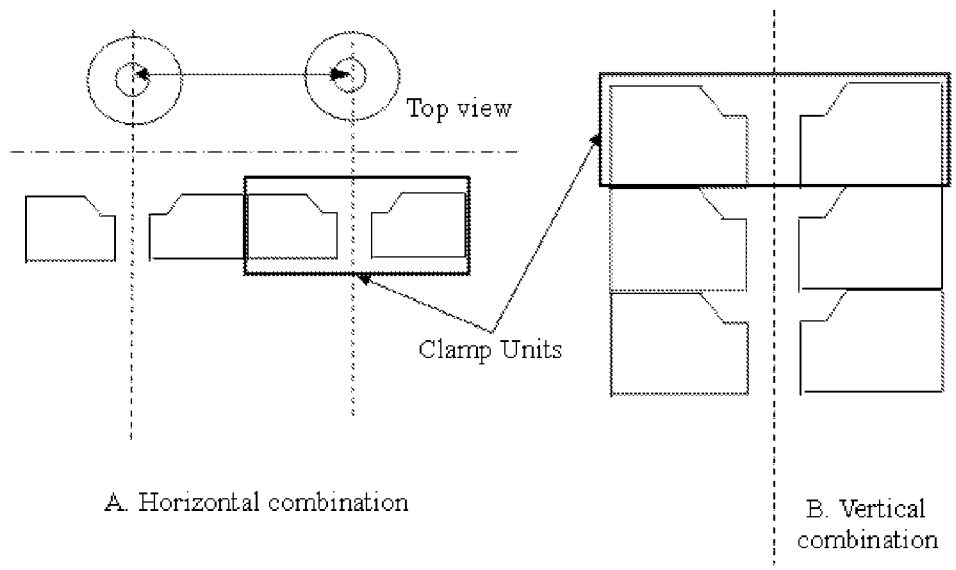
FIG. 3 depicts multiple clamp units used in combination.

Referring now to FIG. 3, the optical fiber clamp units of the present invention could be used in two different ways of a combination as described below.

FIG. 3A shows a horizontal combination of the multiple clamp units, which is suitable for the applications in which multiple optical fibers are handled with a single clamp. In this case, the optical fiber clamp can be formed by placing multiple clamp units in a single clamp chip. Moreover, as the spacing between every two adjacent clamp units is determined by photolithographic patterning, a very high precision, for example, ±0.1~10 µm can be achieved, which is much higher than a precision of the conventional mechanical processing method.

FIG. 3B shows a vertical combination of the multiple clamp units, which is suitable for the applications in which the optical fiber clamp is required to have a certain thickness. In this case, the optical fiber clamp can be formed by vertically stacking multiple clamp unit dies formed after the wafer is grinded and sliced until the optical fiber clamp has the desired thickness.

As indicated above, as the present invention employs mature semiconductor fabrication processes, a commonly used silicon wafer as a base for fabricating the optical fiber clamp, and photolithography equipment to carry out strict control on the size and spacing as well as other physical dimensions of the optical fiber clamp, thereby achieving a submicron order positioning accuracy, much higher than a positioning accuracy of the currently commonly used mechanical processing approach. Moreover, with the use of the ultra-large-scale integration process in the invention, a large number of the strictly controlled clamp units having the same specifications can be formed on a single silicon wafer, thus greatly reducing the manufacturing cost of an individual clamp unit. Therefore, obviously, the invention is also advantageous over the conventional mechanical processing approach in cost control.

It should be appreciated that the embodiments discussed above are merely for describing and explaining the inventive concept disclosed herein and are not intended to limit the present invention in any way. All obvious changes and modifications made in light of the principles of the invention should be construed to be within the scope of the invention. Moreover, the embodiments described above are intended to illustrate and teach ways of implementing the present invention, such that a person of ordinary skill in the art can achieve the objects of the invention by practicing the embodiments described above and various alternatives thereto.

What is claimed is:

1. An optical fiber clamp comprising one or more clamp units, each clamp unit including:
   a clamp body formed of silicon;
   a guide hole formed under a top surface of the clamp body, the guide hole having an upper diameter greater than a lower diameter of the guide hole and having an inclined sidewall; and
   a locating hole connected to and extends downward from a bottom of the guide hole through the clamp body, the locating hole having an upper diameter equal to a lower diameter of the locating hole and smaller than the lower diameter of the guide hole,
   wherein each clamp unit has a thickness of 200 µm to 800 µm.

2. The optical fiber clamp of claim 1, wherein the optical fiber clamp comprises more than one clamp units and the more than one clamp units are arranged in a horizontal direction.

3. The optical fiber clamp of claim 1, wherein each clamp unit has a thickness of 350 µm to 550 µm.

4. The optical fiber clamp of claim 1, wherein the guide hole has a depth of 20 µm to 150 µm, and the inclined sidewall of the guide hole has an inclination of 20 degrees to 60 degrees.

5. The optical fiber clamp of claim 4, wherein the inclined sidewall of the guide hole has an inclination of 35 degrees to 55 degrees.

6. The optical fiber clamp of claim 2, wherein a difference between an actual size and a design size of a spacing between every two adjacent ones of the clamp units is ±0.1~10 µm.

7. The optical fiber clamp of claim 6, wherein a difference between an actual size and a design size of a spacing between every two adjacent ones of the clamp units is ±0.5~2 µm.

8. A method of fabricating an optical fiber clamp, comprising the steps of:
   providing a silicon wafer which includes one or more clamp bodies;
   forming a guide hole under a top surface of each clamp body, the guide hole having an upper diameter greater than a lower diameter of the guide hole and having an inclined sidewall; and
   forming a locating hole connected to and extends downward from a bottom of each guide hole through a corresponding clamp body, the locating hole having an upper diameter equal to a lower diameter of the locating hole and smaller than the lower diameter of the guide hole,
   wherein the method further comprising the steps of:
   a) spin-coating a photoresist on the silicon wafer and forming one or more guide hole patterns in the photoresist by photolithography;
   b) forming one or more guide holes, each having a depth of 20 µm to 150 µm, by etching the silicon wafer using the photoresist as a mask;
   c) removing the photoresist and depositing a hard mask layer having a thickness of 0.5 µm to 10 µm over the silicon wafer;
   d) spin-coating a negative photoresist and forming one or more locating hole patterns in the negative photoresist by photolithography, each locating hole pattern aligning with a corresponding one of the one or more guide holes;
   e) forming one or more locating holes, each having a depth of 250 µm to 500 µm, by first etching the hard mask layer by using the negative photoresist as a mask and then etching the silicon wafer by using the hard mask layer as a mask, leaving a non-etched bottom portion of the silicon wafer with a thickness of 50 µm to 250 µm; and
   f) grinding a backside of the silicon wafer until the one or more locating holes are exposed.

9. The method of claim 8, wherein the hard mask layer formed in step c) is a silicon dioxide layer.

10. The method of claim 8, wherein the hard mask layer formed in step c) has a thickness of 0.5 µm to 2 µm.

11. The method of claim 8, further comprising a step of filling a negative photoresist in the one or more guide holes and removing a portion of the negative photoresist other than portions filled in the one or more guide holes by performing an etch-back process, prior to step c) and after step d).

12. The method of claim 8, wherein in step d), the spin-coated negative photoresist has a volume of 2 ml to 20 ml.

13. The method of claim 12, wherein in step d), the spin-coated negative photoresist has a volume of 4 ml to 8 ml.

14. The method of claim 8, wherein in step d), the negative photoresist is spin-coated in multiple steps.

15. The method of claim 14, wherein in step d), the multiple steps for spin-coating the negative photoresist include:
1) providing a volume of 1 ml to 10 ml of the negative photoresist and spin-coating the negative photoresist in 1 to 5 cycles, each cycle including a coating period of 2 s to 15 s at a rotation speed of 500 rpm to 1200 rpm and an idle interval of 0.5 s to 5 s thereafter;
2) repeating step 1) once to thrice;
3) providing a volume of 0.2 ml to 5 ml of the negative photoresist and spin-coating the negative photoresist for 2 s to 15 s at a rotation speed of 800 rpm to 1500 rpm; and
4) repeating step 3) once to thrice.

\* \* \* \* \*